United States Patent
Maker et al.

(10) Patent No.: US 10,890,824 B2
(45) Date of Patent: Jan. 12, 2021

(54) NONLINEAR CRYSTAL

(71) Applicant: M SQUARED LASERS LIMITED, Glasgow (GB)

(72) Inventors: Gareth Thomas Maker, Glasgow (GB); Graeme Peter Alexander Malcolm, Glasgow (GB)

(73) Assignee: M Squared Lasers Limited, Glasgow (GB)

( * ) Notice: Subject to any disclaimer, the term of this patent is extended or adjusted under 35 U.S.C. 154(b) by 0 days.

(21) Appl. No.: 16/487,579

(22) PCT Filed: Feb. 21, 2018

(86) PCT No.: PCT/GB2018/050454
§ 371 (c)(1),
(2) Date: Aug. 21, 2019

(87) PCT Pub. No.: WO2018/154297
PCT Pub. Date: Aug. 30, 2018

(65) Prior Publication Data
US 2020/0057356 A1 Feb. 20, 2020

(30) Foreign Application Priority Data
Feb. 22, 2017 (GB) .................................. 1702840.8

(51) Int. Cl.
*G02F 1/35* (2006.01)
*G02F 1/37* (2006.01)
*C30B 29/66* (2006.01)

(52) U.S. Cl.
CPC ............ *G02F 1/3501* (2013.01); *C30B 29/66* (2013.01); *G02F 1/3534* (2013.01); *G02F 1/37* (2013.01); *G02F 2001/3509* (2013.01)

(58) Field of Classification Search
CPC ...................... G02F 2001/3509; G02F 1/3501
See application file for complete search history.

(56) References Cited

U.S. PATENT DOCUMENTS

| 5,038,352 A | * | 8/1991 | Lenth | ...................... H01S 5/141 359/326 |
| 5,048,047 A | * | 9/1991 | Kozlovsky | .............. H01S 3/094 372/108 |

(Continued)

FOREIGN PATENT DOCUMENTS

| JP | H03148888 A | 6/1991 |
| JP | 2011197349 A | 10/2011 |
| WO | WO 89/12922 A1 | 12/1989 |

OTHER PUBLICATIONS

International Search Report from PCT/GB2018/050454 dated Jun. 26, 2018.

*Primary Examiner* — Rhonda S Peace
(74) *Attorney, Agent, or Firm* — FisherBroyles, LLP

(57) ABSTRACT

A nonlinear crystal comprising a first curved face and an opposing second curved face is described. The first and second curved faces are arranged to provide the nonlinear crystal with rotational symmetry about at least one axis of the nonlinear crystal. The nonlinear crystal allows for frequency tuning of a generated optical field that is generated by propagating a fundamental optical field through the nonlinear crystal by rotation of the nonlinear crystal about an axis of rotation without any significant, or minimal, deviation being introduced to the generated optical field. These nonlinear crystals can therefore be incorporated into an external cavity frequency doubler or mixer without any need for the employment of optical compensation optics or servo control electronics to automatically realign the cavity mirrors.

8 Claims, 7 Drawing Sheets

(56) References Cited

U.S. PATENT DOCUMENTS

| | | | |
|---|---|---|---|
| 5,095,491 | A | 3/1992 | Kozlovsky et al. |
| 5,290,485 | A | 3/1994 | Gotoh et al. |
| 5,459,744 | A * | 10/1995 | Hayashi ............... G02F 1/3501 359/326 |
| 5,592,326 | A | 1/1997 | Taira |
| 6,882,465 | B1 * | 4/2005 | Boulanger ............ G02F 1/3501 359/326 |
| 7,027,209 | B2 | 4/2006 | Zanger et al. |
| 2004/0007117 | A1 | 1/2004 | Howard, Sr. |
| 2005/0078718 | A1 | 4/2005 | Spinelli et al. |
| 2020/0057356 | A1 * | 2/2020 | Maker .................. G02F 1/3534 |

* cited by examiner

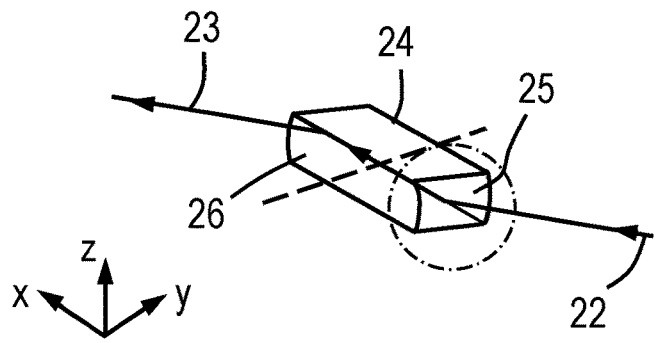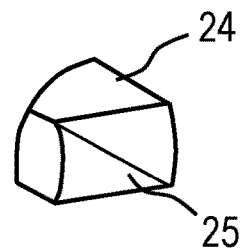
Fig. 4(a)     Fig. 4(b)
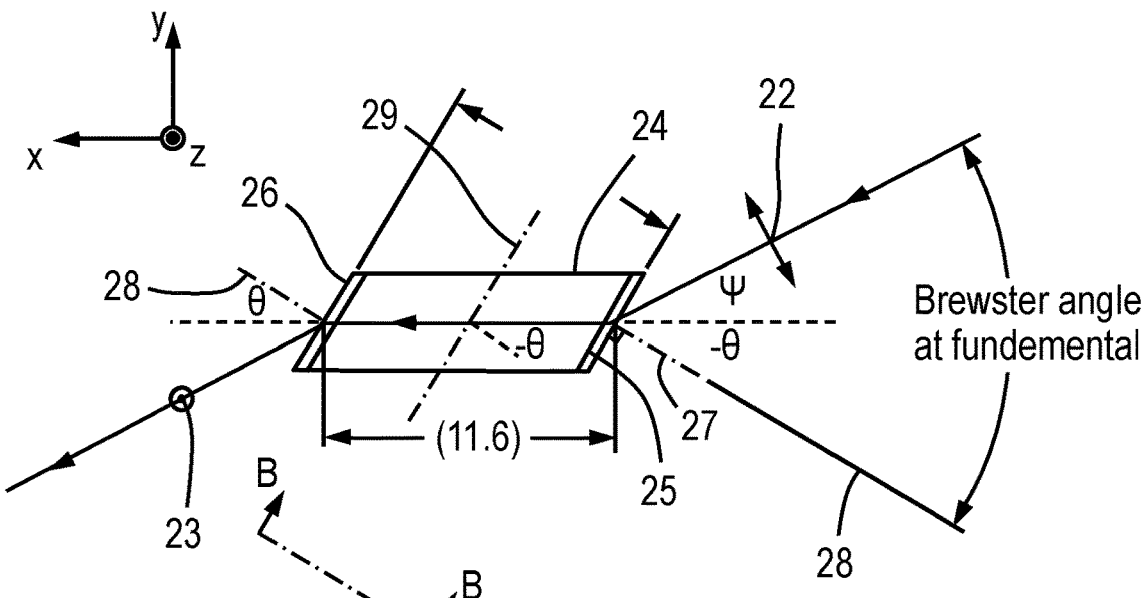
Fig. 4(c)
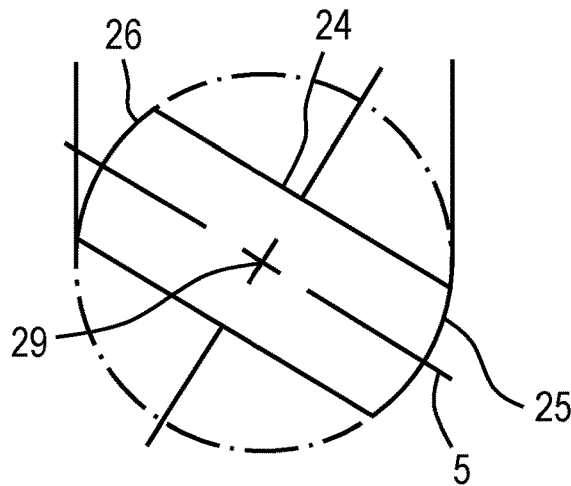
Fig. 4(d)

NONLINEAR CRYSTAL

This application is the U.S. National Stage of International Application No. PCT/GB2018/050454, which was filed on Feb. 21, 2018. This application also claims the benefit of the filing date of GB patent application No. 1702840.8, which was filed on Feb. 22, 2017. The contents of both of those applications are hereby incorporated by reference.

The present invention relates to the field of nonlinear optics and in particular to a new nonlinear crystal design that finds particular application within a frequency mixing cavity.

BACKGROUND TO THE INVENTION

The nonlinear optical properties of crystals have been exploited for many years to mix photons of one or more optical fields in order to generate an output optical field at a desired known frequency or wavelength.

An example of such a process is sum-frequency mixing (SFM). This technique is based on the annihilation of two input photons at angular frequencies $\omega_1$ and $\omega_2$ to generate one photon at frequency $\omega_3$. Sum-frequency generation is a parametric process meaning that the photons satisfy energy conservation, leaving the matter unchanged, as defined by equation (1) below:

$$\hbar\omega_3 \approx \hbar\omega_1 + \hbar\omega_2 \quad (1)$$

wherein $\hbar = h/2\pi$
and h represents Planck's constant

For sum-frequency mixing to occur efficiently, the condition, as defined by equation (2), referred to as phase-matching, must be satisfied:

$$\hbar k_3 \approx \hbar k_1 + \hbar k_2 \quad (2)$$

where $k_1$, $k_2$ and $k_3$ are the angular wavenumbers of the three waves as they travel through the medium. As this condition is satisfied more and more accurately, the sum-frequency generation becomes more and more efficient. Also, as sum-frequency generation occurs over a longer and longer length, the phase-matching must become more and more accurate.

A special case of SFM is second-harmonic generation (SHG) in which $\omega_1 = \omega_2$. This is possibly the most common type of SFM. This is because in SHG, only one input field is required, as compared with SFM, where if $\omega_1 \neq \omega_2$, and thus two simultaneous input fields are needed which can be more difficult to arrange.

As an alternative process to SFM known in the art is difference frequency mixing (DFM). This is a nonlinear process that involves combining two photons of different energies to produce a third photon whose energy equals the difference between those of the incident photons, as defined by equation (3) below:

$$\hbar\omega_3 \approx \hbar\omega_1 - \hbar\omega_2 \quad (3)$$

wherein $\hbar = h/2\pi$
and h represents Planck's constant

For DFM to occur efficiently the following phase-matching condition as defined by equation (4) must be satisfied:

$$\hbar k_3 \approx \hbar k_1 - \hbar k_2 \quad (4)$$

where $k_1$, $k_2$ and $k_3$ are again the angular wavenumbers of the three waves as they travel through the medium.

Other frequency mixing processes known in the art include third harmonic mixing (THM), high harmonic generation (HHG) and optical parametric amplification (OPA) and down conversion.

When choosing a nonlinear crystal for a system a choice of what crystal cut to employ has to be made i.e. how the end faces of the nonlinear crystal will be cut. Generally, there are two different cuts employed in the art for nonlinear crystals: a right-angle cut 1, as presented schematically in FIG. 1(a), and a Brewster-angle cut 2, as presented schematically in FIG. 1(b). Axes are provided within FIG. 1 to assist with clarity of understanding.

The right-angle cut nonlinear crystal 1 of FIG. 1(a) has its polished faces 3 and 4 perpendicular to the optical axis 5 of the nonlinear crystal 1 while the Brewster-angle cut nonlinear crystal 2 of FIG. 1(b) has its faces 6 and 7 located at Brewster's angle ($\beta$) between the normal vector 8 of the polished faces 6 and 7 and the optical axis 5. At Brewster's angle ($\beta$), the surface reflectance of faces 6 and 7 is zero for the light with polarization inside the plane defined by the x and y axes (also defined as p-polarized light).

Although right-angle cut nonlinear crystals 1 are generally easier to manufacture than Brewster-angle cut nonlinear crystals 2, their use leads to higher transmission losses. These losses are increased when the right-angle cut nonlinear crystals 1 are employed with an optical resonator, as is often the case. For this reason, anti-reflective, high reflection or partial reflecting coatings are often applied to the polished faces 3 and 4. Right-angle cut nonlinear crystals 1 are however more limited in their use within high power, especially short-pulse, applications since the coatings applied to the crystal 1 usually have lower damage thresholds than the uncoated faces 6 and 7 of the Brewster-angle cut crystals 2.

As with any second order $X^{(2)}$, or higher order, phenomenon in nonlinear optics, the nonlinear processes can only occur under certain predefined conditions e.g. the light is interacting with matter, which is non-centro-symmetric and the input fields have a very high intensity (typically generated by a laser source). The phase matching requirements of equations (2) and (4) means that the frequency, or wavelength, of the generated output fields can be changed by the co-ordinated tuning of both the wavelength of the input field and the position of the nonlinear medium. Changing the position of the nonlinear medium is typically achieved by rotation or translation of the nonlinear crystal within the input fields.

By way of example, FIG. 2 presents a schematic representation of an external cavity frequency doubler, depicted generally by reference numeral 9, that incorporates Brewster-angle cut crystal 2. The applicant's proprietary SolsTis® ECD-X is a suitable example of such an external cavity frequency doubler 9. As can be seen from FIG. 2, the Brewster-angle cut crystal 2, which may be formed from BBO (Beta barium borate ($BaB_2O_4$)) or LBO (Lithium triborate ($LiB_3O_5$)), is located within a ring cavity defined by a first mirror 10, an output coupler 11 an input coupler 12 and a second mirror 13. The external cavity frequency doubler 9 uses resonant enhancement to convert the output frequency of a continuous-wave, narrow linewidth laser source 14, such as a continuous-wave Ti:Sapphire laser, to produce a frequency doubled output field 15.

Frequency tuning of the output field 15 generated by the external cavity frequency doubler 9 can be achieved by tuning the wavelength of the input field 14 and rotating the Brewster-angle cut crystal 2 about axis 16 to allow maintenance of the phase-matching condition of equation (2). In the presently described example, the Brewster-angle cut crystal 2 lies substantially within the plane defined by the x and y axes while the axis of rotation 16 also lies in this plane and forms an acute angle with the y axis.

As is known in the art, when rotation of a nonlinear crystal 1 or 2 is employed within a frequency tuning process a corresponding deviation of the propagation direction of the optical field exiting the nonlinear crystal 1 or 2 is experienced. This deviation is due to the effects of refraction within the nonlinear crystal 1 or 2. This deviation of the output field 15 is problematic to the development of commercial resonator based devices, since it requires automated realignment to be incorporated into the design of these systems.

One solution known in the art is to incorporate an optical plate within the resonator cavity that is controlled by servo control electronics to automatically rotate in a manner to compensate for the deviation introduced by rotation of the nonlinear crystal 1 or 2. Such solutions however have the disadvantage that they result in an increase in the internal optical losses within the resonator cavity and an increase in the losses experienced by the light generated by the nonlinear process. These solutions also act to increase the overall footprint of the system.

An alternative solution, as employed by the external cavity frequency doubler 9 of FIG. 2, is to employ servo control electronics (not shown) to automatically realign each of the cavity mirrors 10, 11, 12 and 13 as the Brewster-angle cut crystal 2 is rotated. Although a good solution to the problem of beam deviation, the employment of such servo control electronics is significantly more complex, and thus more expensive, than those above described solutions based on incorporating an additional optical plate within the resonator cavity and also result in significant spatial deviation of the nonlinear generated beam.

SUMMARY OF INVENTION

It is therefore an object of an embodiment of the present invention to obviate or at least mitigate the foregoing disadvantages of the methods and apparatus known in the art for tuning the frequency of the output field generated by a nonlinear crystal.

According to a first aspect of the present invention there is provided a nonlinear crystal comprising a first curved face and an opposing second curved face, wherein the first and second curved faces are arranged to provide the nonlinear crystal with rotational symmetry about at least one axis of the nonlinear crystal.

The above arrangement allows for frequency tuning of a generated optical field that is generated by propagating a fundamental optical field through the nonlinear crystal by the co-ordinated tuning of both the wavelength of the input optical field and the rotation of the nonlinear crystal about the axis of rotation, without any substantial, or minimal, deviation being introduced to the generated optical field.

An axis of rotation of the nonlinear crystal may coincides with an axis of the nonlinear crystal.

The first and second curved faces may be arranged to provide the nonlinear crystal with rotational symmetry about at least two axes of the nonlinear crystal.

The first and second curved faces may comprise diametrically opposite first and second sections of a right circular cylinder. In this embodiment, the nonlinear crystal exhibits infinite rotational symmetry about at least one axis of the nonlinear crystal.

The first and second curved faces may comprise diametrically opposite first and second sections of a truncated right circular cylinder. In this embodiment, the nonlinear crystal exhibits two-fold rotational symmetry about at least one axis of the nonlinear crystal.

The first curved face may comprise a section of a curved surface of a right circular cylinder wherein a normal to the first curved face is located at an angle of $-\vartheta$ with an optical axis of the nonlinear crystal. The second curved face may comprise a section of a curved surface of a right circular cylinder wherein a normal to the second curved face is located at an angle of $\vartheta$ with the optical axis of the nonlinear crystal. In this embodiment, the nonlinear crystal exhibits two-fold rotational symmetry about at least one axis of the nonlinear crystal.

The first curved face may comprise a first section of a sphere having a first radius of curvature and the second curved face may comprise a second section of a sphere having a second radius of curvature wherein the length of the first and second radii of curvature are equal. In this embodiment, the nonlinear crystal exhibits two-fold rotational symmetry about at least one axis of the nonlinear crystal.

The first section of a sphere and the second section of a sphere may share a common centre.

Alternatively, a normal to the first face is located at an angle of $-\vartheta$ with an optical axis of the nonlinear crystal and a normal to the second face is located at an angle of $\vartheta$ with an optical axis of the nonlinear crystal. Preferably $|\vartheta|$ is greater than 0° but less than Brewster's angle ($\beta$).

According to a second aspect of the present invention there is provided an external cavity frequency doubler comprising a nonlinear crystal in accordance with the first aspect of the present invention.

Frequency tuning of an output field generated by the external cavity frequency doubler can be achieved by tuning the wavelength of an input field and rotating the nonlinear crystal about the axis of rotation. As a result of the rotational symmetry of the nonlinear crystal about the axis of rotation, frequency tuning of the output field generated by the external cavity frequency is achieved with no significant, or minimum, levels of deviation being experienced by output field. As a result, the described external cavity frequency doubler does not require the employment of optical compensation optics or servo control electronics to automatically realign each of the cavity mirrors.

Embodiments of the second aspect of the invention may comprise features to implement the preferred or optional features of the first aspect of the invention or vice versa.

According to a third aspect of the present invention there is provided an external cavity frequency mixer comprising a nonlinear crystal in accordance with the first aspect of the present invention.

Embodiments of the third aspect of the invention may comprise features to implement the preferred or optional features of the first aspect of the invention or vice versa.

According to a fourth aspect of the present invention there is provided a method of producing a nonlinear crystal comprising
    processing a bulk crystal to provide the nonlinear crystal with a first curved face and an opposing second curved face, wherein the first and second curved faces are arranged to provide the nonlinear crystal with rotational symmetry about at least one axis of the nonlinear crystal.

Preferably the processing of the bulk crystal comprises one or more processing procedures selected from the group of processing procedures comprising cutting, shaping and polishing.

Embodiments of the fourth aspect of the invention may comprise features to implement the preferred or optional features of the first aspect of the invention or vice versa.

BRIEF DESCRIPTION OF DRAWINGS

There will now be described, by way of example only, various embodiments of the invention with reference to the drawings, of which:

FIG. 4 presents (a) a perspective view; (b) a perspective end view; (c) a top view; and (d) a side view along line b-b of FIG. 4(c), of a nonlinear crystal in accordance with an alternative embodiment of the present invention;

Figure 1A:
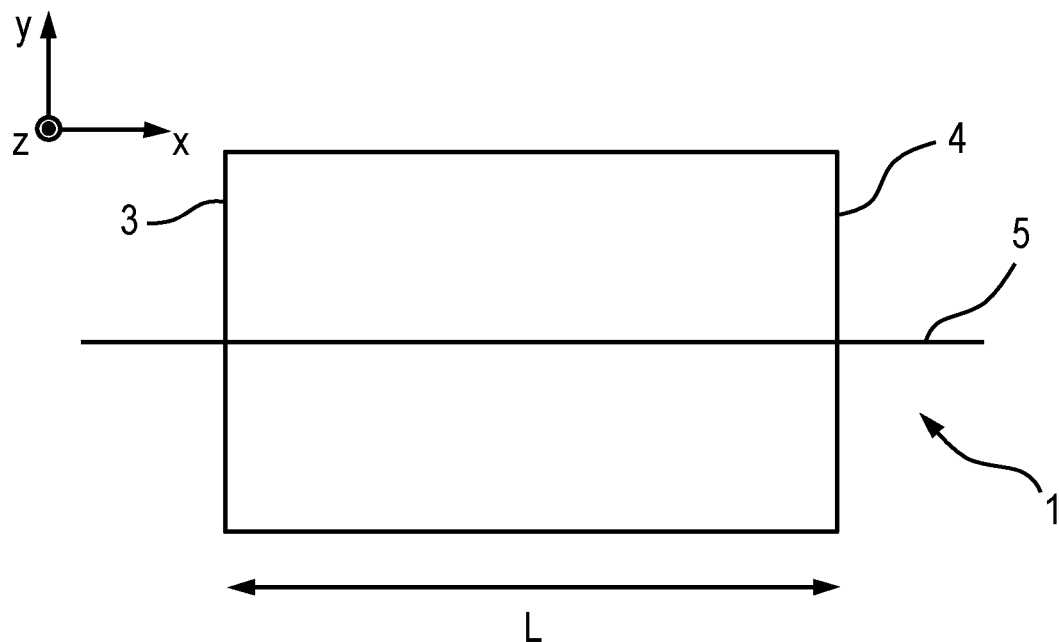
FIG. 1 presents: (a) a schematic representation of a right-angle cut nonlinear crystal known in the art; and (b) a schematic representation of a Brewster-angle cut nonlinear crystal known in the art.
Figure 1B:
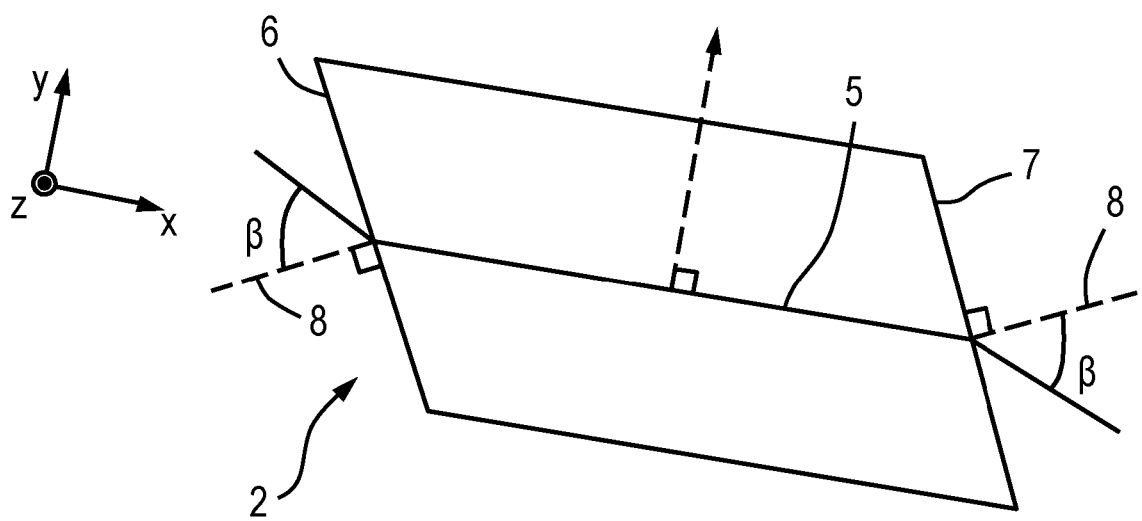

In the description which follows, like parts are marked throughout the specification and drawings with the same reference numerals. The drawings are not necessarily to scale and the proportions of certain parts have been exaggerated to better illustrate details and features of embodiments of the invention.

DETAILED DESCRIPTION

Various embodiments of a nonlinear crystal in accordance with aspects of the present invention will now be described with reference to FIGS. 3 to 6. The described nonlinear crystals may be formed from BBO (Beta barium borate ($BaB_2O_4$)) or LBO (Lithium triborate ($LiB_3O_5$)) or other known nonlinear material. Axes have again been provided within these figures for ease of reference with the x-axis being aligned with the optical axis 5 of the described nonlinear crystal.

Figure 3A:
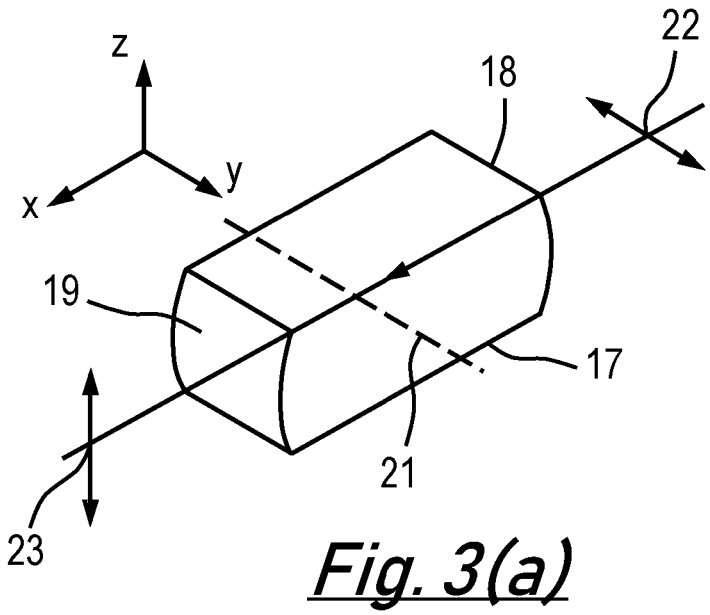
FIG. 3 presents (a) a perspective view and (b) a side view, of a nonlinear crystal in accordance with an embodiment of the present invention.
Figure 3B:
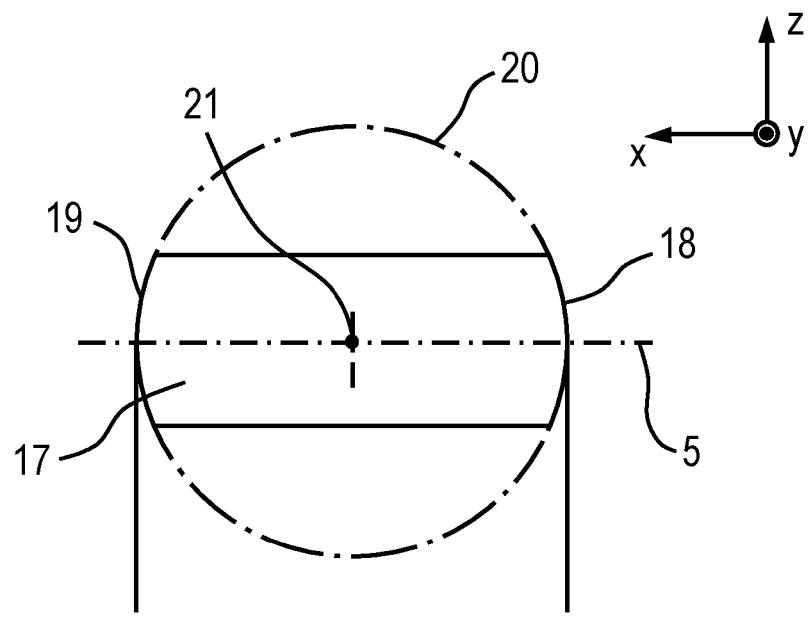

FIG. 3 presents (a) a perspective view and (b) a side view, of a nonlinear crystal 17 in accordance with an embodiment of the present invention. The nonlinear crystal 17 can be seen to comprise a first curved face 18 and a second curved face 19 located on opposite sides of the nonlinear crystal 17. From FIG. 3(b) it can be seen that the first 18 and second curved faces 19 comprise two diametrically opposite sections of a curved surface of a right circular cylinder 20 i.e. the radius of curvature of the first 18 and second curved faces 19 are both equal and centred on an axis 21 (which is parallel to the y-axis) of the right circular cylinder 20. As will be appreciated by the skilled reader, the above arrangement provides the nonlinear crystal 17 with two-fold rotational symmetry about axis 21. It is noted that the nonlinear crystal 17 also comprises two-fold symmetry about the optical or x axis as well as two-fold symmetry about the z axis.

It will be appreciated that anti-reflective coatings may be applied to the first 18 and or second curved faces 19 in order to enhance the non-linear operation of the nonlinear crystal 17.

In FIG. 3(a), a fundamental optical field 22 at 800 nm, having a linear polarisation parallel to the axis 21 of the circular cross-sectioned cylinder 20 (and thus the y-axis), is shown incident upon the first curved face 18 of the nonlinear crystal 17 so as to propagate along the optical axis 5 (x-axis) of the nonlinear crystal 17. The nonlinear properties of the crystal 17 result in the generation of a second harmonic optical field 23 at 400 nm exiting the nonlinear crystal 17 via the second curved face 19. The second harmonic optical field 23 has a linear polarisation parallel to the z-axis.

As described above, frequency tuning of the second harmonic optical field 23 can be achieved by tuning the wavelength of the fundamental optical field 22 and rotating the nonlinear crystal 17 about axis 21 to allow for maintenance of the desired phase-matching condition. Significantly, since the nonlinear crystal 17 exhibits rotational symmetry about axis 21 frequency tuning of the second harmonic optical field 23 is achieved with no significant, or minimal, levels of deviation being introduced.

It will be appreciated by the skilled reader that because the first 18 and second curved faces 19 of the nonlinear crystal 17 are not orientated at Brewster's angle then the fundamental optical field 22, and hence the generated second harmonic optical field 23, can be arranged in the opposite sense to that described with reference to FIG. 3.

Although the nonlinear crystal 17 shown in FIG. 3 has two-fold rotational symmetry about axis 21 it will be appreciated that in alternative embodiments the order of rotational symmetry could be increased. For example, if the nonlinear crystal comprised a complete right circular cylinder (i.e. the first and second curved surface of the nonlinear crystal 17 extended over 360°—for example forming a disc) then the nonlinear crystal would be infinitely rotationally symmetrical about axis 21.

FIG. 4 presents (a) a perspective view; (b) a perspective end view of the section circled in (a); (c) a top view; and (d) a side view along line b-b of FIG. 4(c), respectively, of a nonlinear crystal 24 in accordance with an alternative embodiment of the present invention. As with the nonlinear crystal 17 of FIG. 3, nonlinear crystal 24 can be seen to comprise a first curved face 25 and a second curved face 26 located on opposite sides of the nonlinear crystal 24. The first curved face 25 and the second curved face 26 both comprise a section of a curved surface of a right circular cylinder.

From FIG. 4(c) it can be seen that the first curved face 25 is arranged such that a normal 27 to this surface is at an angle of −ϑ with the optical axis 5 within nonlinear crystal 24 (i.e. the x-axis). In a similar manner, the second curved face 26 is arranged such that a normal 28 to this surface is at an angle of ϑ with the optical axis 5 within the nonlinear crystal 24 (x-axis) of the nonlinear crystal 24. The radius of curvature of the first 25 and second curved faces 26 are again equal and lie on a common axis 29, this axis 29 also being located at an angle of ϑ with respect to the optical axis 5 (i.e. the x-axis). It will be appreciated by the skilled reader from FIG.

4(d), that the above arrangement provides the nonlinear crystal 24 with a two-fold rotational symmetry about the z-axis.

In FIGS. 4(a) and 4(c), fundamental optical field 22 at 800 nm, and having a linear polarisation in the x-y plane is shown incident upon the first curved face 25 of the nonlinear crystal 24 at an angle of Ψ with the optical axis 5 (x-axis). The angles −ϑ and Ψ are chosen such that:

$$|\vartheta|+|\Psi|=\beta \quad (5)$$

where β again represent Brewster's angle.

With this arrangement, when the fundamental optical field 22 propagates along the optical axis 5 (x-axis) of the nonlinear crystal 24, the nonlinear properties of the crystal 24 result in the generation of a second harmonic optical field 23 at 400 nm exiting the nonlinear crystal 24 via the second curved face 26. The second harmonic optical field 23 has a linear polarisation parallel to the z-axis.

Frequency tuning of the second harmonic optical field 23 can be achieved by tuning the wavelength of the fundamental optical field 22 and rotating the nonlinear crystal 24 about the axis of rotation 29 to allow for maintenance of the desired phase-matching condition. Significantly, frequency tuning of the second harmonic optical field 23 is again achieved with no significant, or minimal, deviation being introduced.

FIG. 5 presents (a) a perspective view; (b) a perspective end view of the section circled in (a); (c) a top view; and (d) a side view, respectively, of a nonlinear crystal 30 in accordance with a further alternative embodiment of the present invention. As with the above described nonlinear crystals 17 and 24, nonlinear crystal 30 can be seen to comprise a first curved face 31 and a second curved face 32 located on opposite sides of the nonlinear crystal 30. In this embodiment, the first 31 and second curved faces 32 both comprise sections of a sphere, having equal radii of curvature, and which share a common centre. The above arrangement provides the nonlinear crystal 30 with a two-fold rotational symmetry about axis 33. It is noted that the nonlinear crystal 30 comprises four-fold symmetry about the optical or x axis as well as two-fold symmetry about the z axis. The nonlinear crystal 30 could be made infinitely rotationally symmetrical about the optical or x axis and the z axis if it comprised a complete sphere.

It will be appreciated that anti-reflective coatings may be applied to the first 31 and or second curved faces 32 in order to enhance the non-linear operation of the nonlinear crystal 30.

Figure 5C:
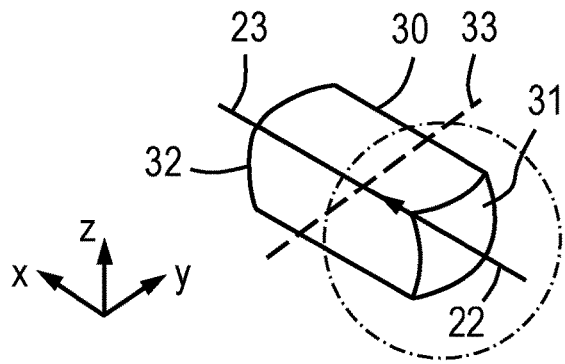
FIG. 5 presents (a) a perspective view; (b) a perspective end view; (c) a top view; and (d) a side view, of a nonlinear crystal in accordance with a further alternative embodiment of the present invention.
Figure 5C:
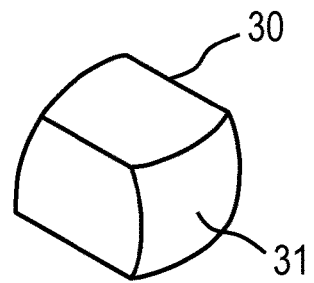
Figure 5C:
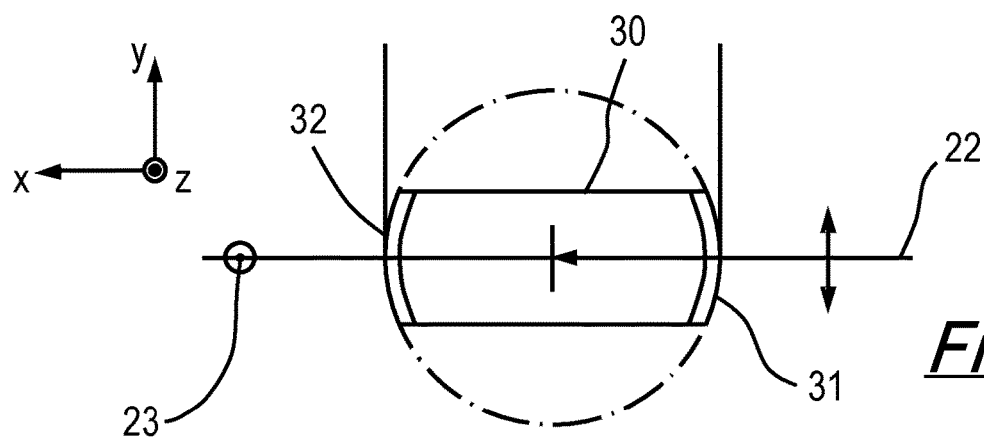
Figure 5D:
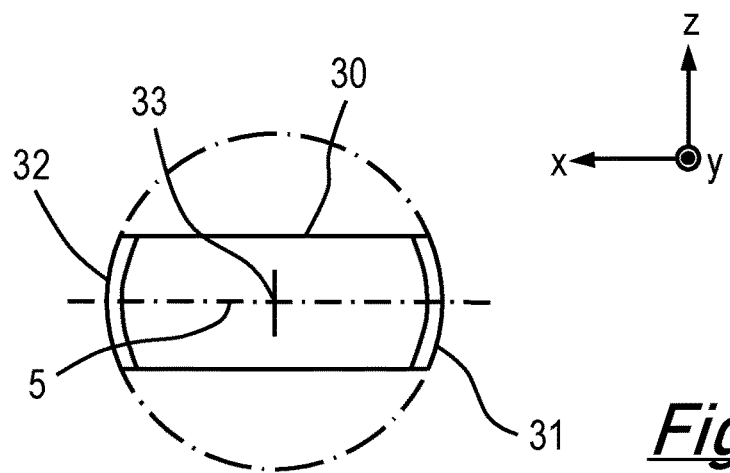

In FIGS. 5(a) and 5(c), fundamental optical field 22 at 800 nm, having a linear polarisation parallel to the axis of rotation 33 (and thus the y-axis), is shown incident upon the first curved face 31 of the nonlinear crystal 30 so as to propagate along the optical axis 5 (x-axis) of the nonlinear crystal 30. The nonlinear properties of the crystal 30 again result in the generation of a second harmonic optical field 23 at 400 nm exiting the nonlinear crystal 30 via the second curved face 32. The second harmonic optical field 23 has a linear polarisation parallel to the z-axis.

Tuning of the wavelength of the fundamental optical field 22 while rotating the nonlinear crystal 30 about the axis of rotation 33 provides a means for frequency tuning the second harmonic optical field 23 without any significant, or minimal, deviation being introduced to the second harmonic optical field 23.

It will be appreciated by the skilled reader that because the first 31 and second curved faces 32 of the nonlinear crystal 30 are not orientated at Brewster's angle then the fundamental optical field 22, and hence the generated second harmonic optical field 23, can be arranged in the opposite sense to that described with reference to FIG. 5.

FIG. 6 presents (a) a perspective view; (b) a perspective end view of the section circled in (a); (c) a top view; and (d) a side view along line b-b of FIG. 6(c), respectively, of a nonlinear crystal 34 in accordance with a further alternative embodiment of the present invention. Nonlinear crystal 34 can be seen to comprise a first curved face 35 and a second curved face 36 located on opposite sides of the nonlinear crystal 34. In this embodiment, the first curved face 35 and the second curved face 36 both comprise a section of a sphere. From FIG. 6(c) it can be seen that the first curved face 35 is arranged such that a normal 37 to this surface is at an angle of −ϑ with the optical axis 5 within the nonlinear crystal 34 (i.e. the x-axis). In a similar manner, the second curved face 36 is arranged such that a normal 38 to this surface is at an angle of ϑ with the optical axis 5 within the nonlinear crystal 24 (i.e. the x-axis). The radius of curvature of the first 35 and second curved faces 36 are again equal and lie on a common axis 39, this axis 39 being located at an angle of ϑ with the optical axis 5 (x-axis). It will be appreciated by the skilled reader from FIG. 6(d), that the above arrangement provides the nonlinear crystal 34 with a two-fold rotational symmetry about the z-axis.

Figure 6A:
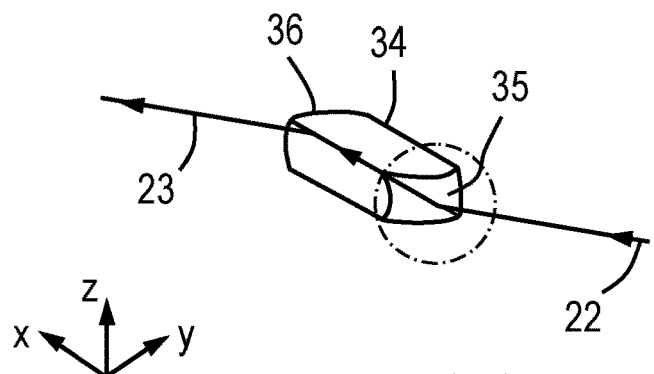
FIG. 6 presents (a) a perspective view; (b) a perspective end view; (c) a top view; and (d) a side view along line b-b of FIG. 6(c), of a nonlinear crystal in accordance with a further alternative embodiment of the present invention.
Figure 6B:
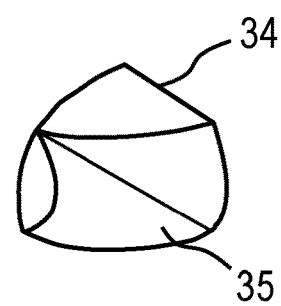
Figure 6C:
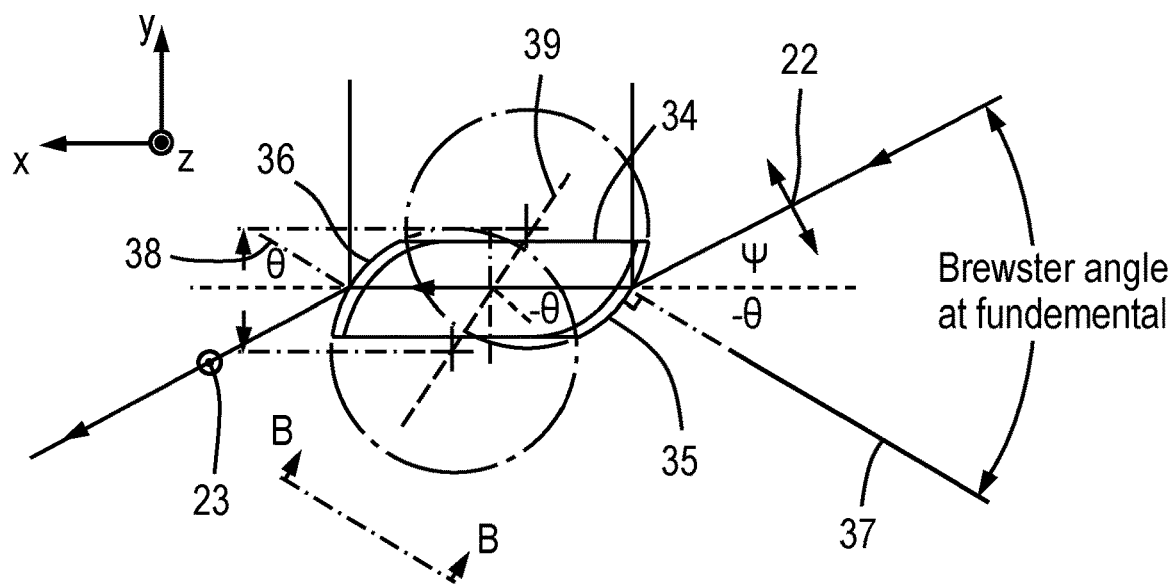
Figure 6D:
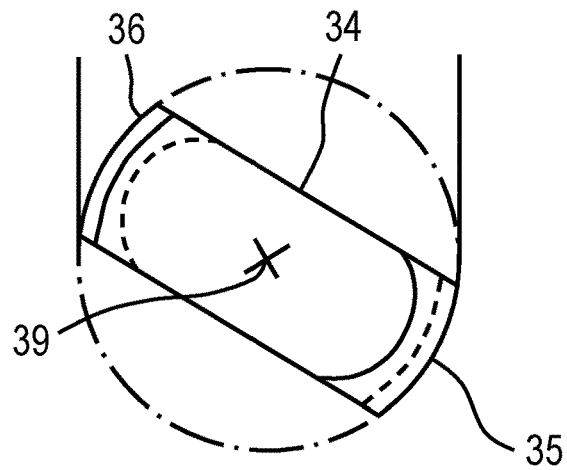

In FIGS. 6(a) and 6(c), fundamental optical field 22 at 800 nm, and having a linear polarisation in the x-y plane is shown incident upon the first curved face 25 of the nonlinear crystal 34 at an angle of Ψ with the optical axis 5 within the nonlinear crystal 24 (i.e. the x-axis). In a similar manner to that described above, angles −ϑ and Ψ are preferably chosen such that the satisfy equation 1.

With this arrangement, when the fundamental optical field 22 propagates along the optical axis 5 (x-axis) of the nonlinear crystal 34, the nonlinear properties of the crystal 34 result in the generation of the second harmonic optical field 23 at 400 nm exiting the nonlinear crystal 34 via the second curved face 36. The second harmonic optical field 23 has a linear polarisation parallel to the z-axis.

Tuning of the wavelength of the fundamental optical field 22 while rotating the nonlinear crystal 34 about the axis of rotation 39 again provides a means for frequency tuning the second harmonic optical field 23 with no significant, or minimal, deviation being introduced to the second harmonic optical field 23.

Figure 2:
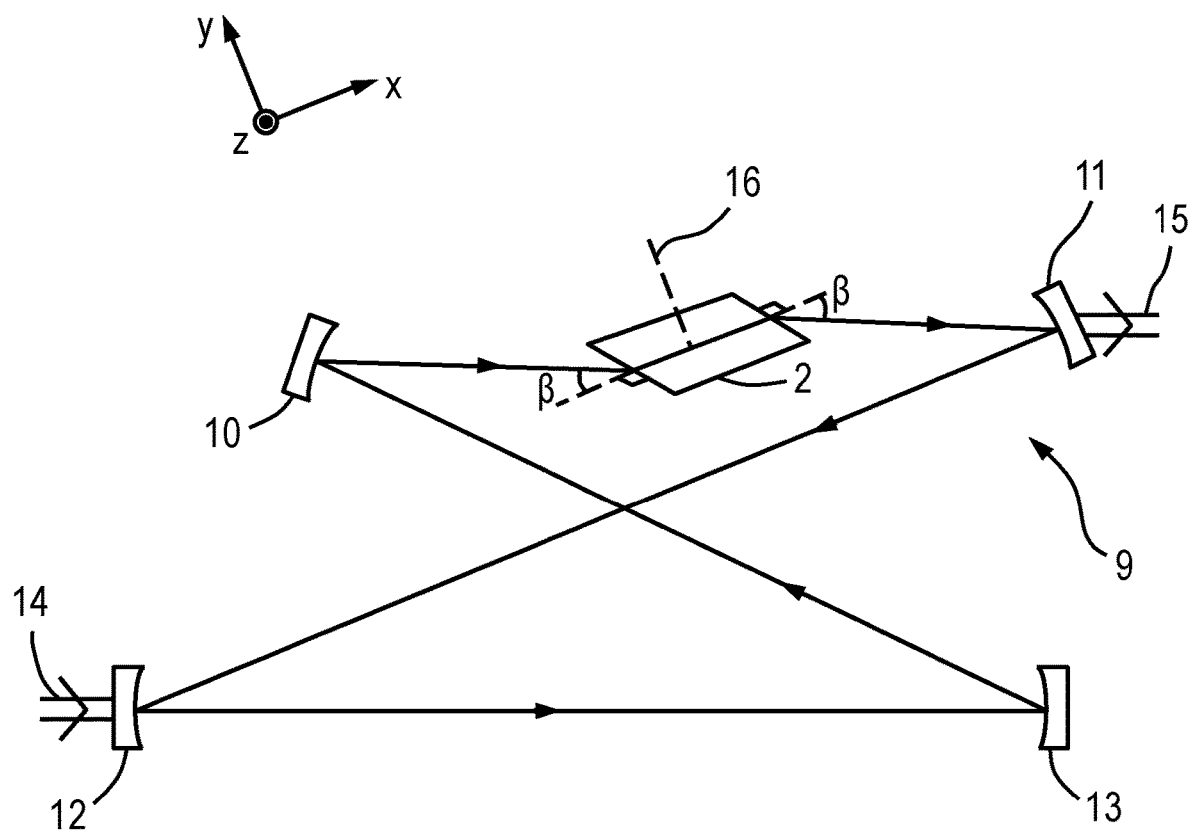
FIG. 2 presents a schematic representation of an external cavity frequency doubler known in the art.
Figure 7:
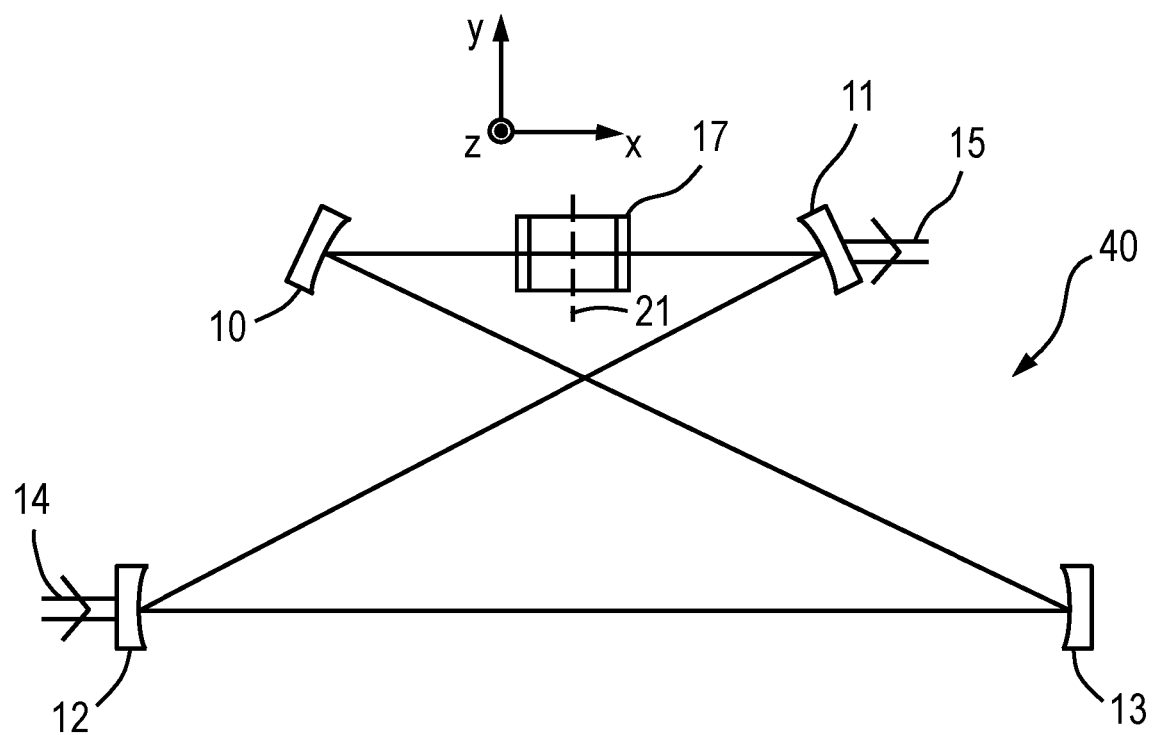
FIG. 7 presents a schematic representation of an external cavity frequency doubler incorporating the nonlinear crystal of FIG. 3.

FIG. 7 presents a schematic representation of an external cavity frequency doubler, depicted generally by reference numeral 40, that incorporates the nonlinear crystal 17 of FIG. 3. In a similar manner to the external cavity frequency doubler 9 as described above with reference to FIG. 2, the nonlinear crystal 17 is located within a ring cavity defined by a first mirror 10, an output coupler 11 an input coupler 12 and a second mirror 13. The external cavity frequency doubler 40 again uses resonant enhancement to convert the output frequency of a continuous-wave, narrow linewidth laser source 14, such as a continuous-wave Ti:Sapphire laser, to produce a frequency doubled output field 15.

Frequency tuning of the output field 15 generated by the external cavity frequency doubler 40 can be achieved by tuning the wavelength of the input field 14 and rotating the nonlinear crystal 17 about axis 21, as described above. In the presently described example, the nonlinear crystal 17 lies substantially within the plane defined by the x and y axes while the axis of rotation 21 is substantially parallel to the y axis.

As a result frequency tuning of the output field 15, generated by the external cavity frequency doubler 40 by the co-ordinated tuning of the wavelength of the input optical field 14 and the rotational position of the nonlinear crystal 17 about axis 21, is achieved with no significant, or minimal, deviation being experienced by output field 15. Significantly, there is no need for the external cavity frequency doubler 40 to incorporate an optical plate within the resonator cavity that is controlled by servo control electronics or to employ servo control electronics to automatically realign each of the cavity mirrors 10, 11, 12 and 13 as the nonlinear crystal 17. As a result, the external cavity frequency doubler 40 exhibits a simpler design, that is more stable and cheaper to produce, when compared with those systems known in the art.

In this embodiment, it can be seen that the axis of rotation 21 coincides with an axis of rotational symmetry of the nonlinear crystal 17, namely the y-axis. This would also be the case if the nonlinear crystal 30 of FIG. 5 was employed within the external cavity frequency doubler 40.

However, if either the nonlinear crystal 24 of FIG. 4, or the nonlinear crystal 34 of FIG. 6, are employed within into the external cavity frequency doubler 40 then the associated axes of rotation 24 and 29 do not coincide with the axis of rotational symmetry of the nonlinear crystals 24 and 34 i.e. the (z-axis). Instead the axes of rotation 24 and 29 are offset to at an angle $-\vartheta$ with respect to the associated y-axis of the nonlinear crystal 24 and 34.

As long as the associated nonlinear crystals 24, 30 or 34 are rotated about its associated axis 29, 33 or 39, respectively, then frequency tuning of the output field 15 generated by the external cavity frequency doubler 40 can be achieved with no with no significant, or minimal, deviation being experienced by output field 15.

Although the above described external cavity frequency doubler is based on second harmonic generation nonlinear mixing processes it will be apparent to the skilled reader that the described nonlinear crystal may be employed with other frequency mixing systems that employ other nonlinear processes known in the art including: more general sum frequency mixing (SFM); difference frequency mixing (DFM); third harmonic mixing (THM); high harmonic generation (HHG); and optical parametric amplification (OPA) and down conversion. In addition, the described crystals do not need to be employed within a resonator or cavity based system but instead can be employed in alternative systems based on a single pass of the fundamental or input field.

It will be appreciated that the above described nonlinear crystals may be produced from a bulk crystal by employing one or more known crystal processing techniques. For example, the production of the nonlinear crystals may employ one or more cutting, shaping or polishing processing techniques.

A nonlinear crystal comprising a first curved face and an opposing second curved face is described. The first and second curved faces are arranged to provide the nonlinear crystal with rotational symmetry about at least one axis of the nonlinear crystal. The nonlinear crystal allows for frequency tuning of a generated optical field that is generated by propagating a fundamental optical field through the nonlinear crystal by rotation of the nonlinear crystal about an axis of rotation without any significant, or minimal, deviation being introduced to the generated optical field. These nonlinear crystals can therefore be incorporated into an external cavity frequency doubler or mixer without any need for the employment of optical compensation optics or servo control electronics to automatically realign the cavity mirrors.

Throughout the specification, unless the context demands otherwise, the term "comprise" or "include", or variations such as "comprises" or "comprising", "includes" or "including" will be understood to imply the inclusion of a stated integer or group of integers, but not the exclusion of any other integer or group of integers.

Furthermore, reference to any prior art in the description should not be taken as an indication that the prior art forms part of the common general knowledge.

The foregoing description of the invention has been presented for purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. A nonlinear crystal comprising:
a first curved face and an opposing second curved face;
an optical axis for a fundamental optical field incident upon the first curved face being at an angle of $\Psi$ with the optical axis;
an axis of rotation, wherein rotation of the nonlinear crystal about the axis of rotation allows for maintenance of a phase matching condition within the nonlinear crystal when a wavelength of the fundamental optical field is tuned, wherein the radius of curvature of the first and second curved faces are equal and centered on the axis of rotation thus providing the nonlinear crystal with rotational symmetry about at least one axis of the nonlinear crystal,
wherein the first curved face comprises a first section of a curved surface of a right circular cylinder and the second curved face comprises a second section of a curved surface of a right circular cylinder, wherein a normal to the first curved face is located at an angle of $-\vartheta$ with the optical axis and chosen such that the $|\vartheta|+|\Psi|=$Brewster-angle ($\beta$) for the nonlinear crystal and a normal to the second curved surface is located at an angle of $\vartheta$ with the optical axis of the nonlinear crystal.

2. An external cavity frequency doubler comprising a nonlinear crystal in accordance with claim 1.

3. An external cavity frequency mixer comprising a nonlinear crystal in accordance with claim 1.

4. A method of producing a nonlinear crystal as claimed is claim 1 wherein the method comprises performing one or more processing procedures on a bulk crystal, the one or more processing procedures selected from the group of processing procedures comprising cutting, shaping and polishing of the bulk crystal.

5. A nonlinear crystal comprising:
a first curved face and an opposing second curved face;
an optical axis for a fundamental optical field incident upon the first curved face at an angle of $\Psi$ with the optical axis; and
an axis of rotation, wherein rotation of the nonlinear crystal about the axis of rotation allows for maintenance of a phase matching condition within the nonlinear crystal when a wavelength of the fundamental optical field is tuned, wherein the radius of curvature of the first and second curved faces are equal and centered on the axis of rotation thus providing the nonlinear crystal with rotational symmetry about at least one axis of the nonlinear crystal, and the first curved face comprises a first section of a sphere and the second curved face comprises a second section of the sphere, wherein a normal to the first curved face is located at an angle of $-\vartheta$ with the optical axis and chosen such that $|\vartheta|+|\Psi|$=Brewster-angle ($\beta$) for the nonlinear crystal and a normal to the second curved surface is located at an angle of $\vartheta$ with the optical axis of the nonlinear crystal.

6. An external cavity frequency doubler comprising a nonlinear crystal in accordance with claim 5.

7. An external cavity frequency mixer comprising a nonlinear crystal in accordance with claim 5.

8. A method of producing a nonlinear crystal as claimed in claim 5 wherein the method comprises performing one or more processing procedures on a bulk crystal the one or more processing procedures selected from the group of processing procedures comprising cutting, shaping and polishing of the bulk crystal.

* * * * *